United States Patent
Langguth et al.

(10) Patent No.: US 12,278,486 B2
(45) Date of Patent: Apr. 15, 2025

(54) ELECTROSTATIC DISCHARGE PROTECTION FOR RF PINS

(71) Applicant: Infineon Technologies AG, Neubiberg (DE)

(72) Inventors: Gernot Langguth, Oberhaching (DE); Christoph Eichenseer, Regensburg (DE); Stefan Kokorovic, Villach (AT)

(73) Assignee: Infineon Technologies AG, Neubiberg (DE)

( * ) Notice: Subject to any disclaimer, the term of this patent is extended or adjusted under 35 U.S.C. 154(b) by 643 days.

(21) Appl. No.: 17/584,990

(22) Filed: Jan. 26, 2022

(65) Prior Publication Data

US 2023/0238797 A1    Jul. 27, 2023

(51) Int. Cl.
*H02H 9/04* (2006.01)
*H01L 27/02* (2006.01)
*H02H 9/00* (2006.01)

(52) U.S. Cl.
CPC ......... *H02H 9/046* (2013.01); *H01L 27/0255* (2013.01); *H02H 9/005* (2013.01)

(58) Field of Classification Search
CPC ............. H02H 9/046; H02H 9/005; H01L 27/0248–0296
See application file for complete search history.

(56) References Cited

U.S. PATENT DOCUMENTS

| | | |
|---|---|---|
| 2012/0170161 A1 | 7/2012 | Lin et al. |
| 2012/0176708 A1 | 7/2012 | Tsai |
| 2012/0176709 A1* | 7/2012 | Tsai ................. H03F 1/52 29/825 |
| 2012/0212865 A1 | 8/2012 | Tsai et al. |
| 2014/0168834 A1* | 6/2014 | Kanemaru ......... H01L 27/0288 361/56 |
| 2015/0184344 A1 | 7/2015 | Houze |
| 2016/0336740 A1 | 11/2016 | Parthasarathy et al. |
| 2016/0336744 A1* | 11/2016 | Parthasarathy ........ H02H 9/046 |
| 2017/0331511 A1* | 11/2017 | Yoo ................ H04B 1/48 |
| 2021/0044104 A1 | 2/2021 | Domanski et al. |

FOREIGN PATENT DOCUMENTS

WO      2013106484 A1    7/2013

* cited by examiner

*Primary Examiner* — Jared Fureman
*Assistant Examiner* — Christopher J Clark
(74) *Attorney, Agent, or Firm* — Slater Matsil, LLP

(57) ABSTRACT

A radio frequency integrated circuit (RFIC) device includes: a first RF input/output (I/O) terminal; a second RF I/O terminal, where the first and the second RF I/O terminals are configured to transmit or receive an RF signal; a capacitor coupled between the first and the second RF I/O terminals; a first coil coupled between the first and the second RF I/O terminals, where the first coil is configured to provide ESD protection to the capacitor during a first ESD event; and a fast transient ESD protection circuit coupled between the first and the second RF I/O terminals, where the fast transient ESD protection circuit is configured to provide ESD protection to the capacitor during a second ESD event different from the first ESD event, where a first rise time of the first ESD event is longer than a second rise time of the second ESD event.

20 Claims, 12 Drawing Sheets

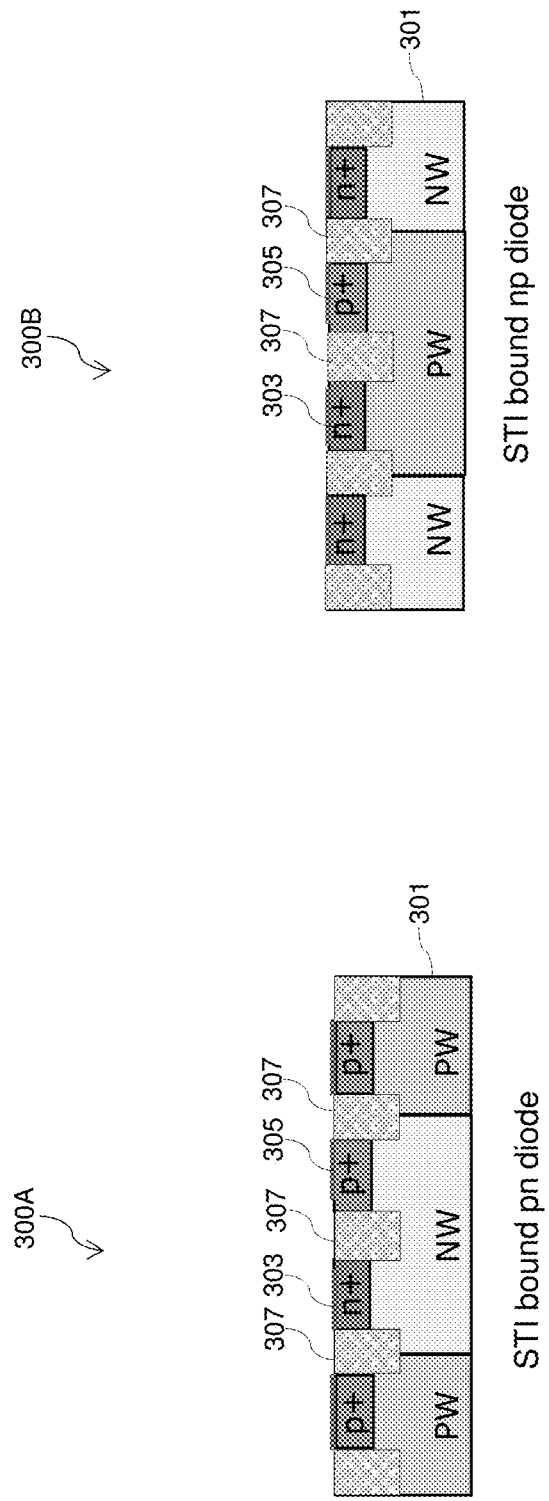

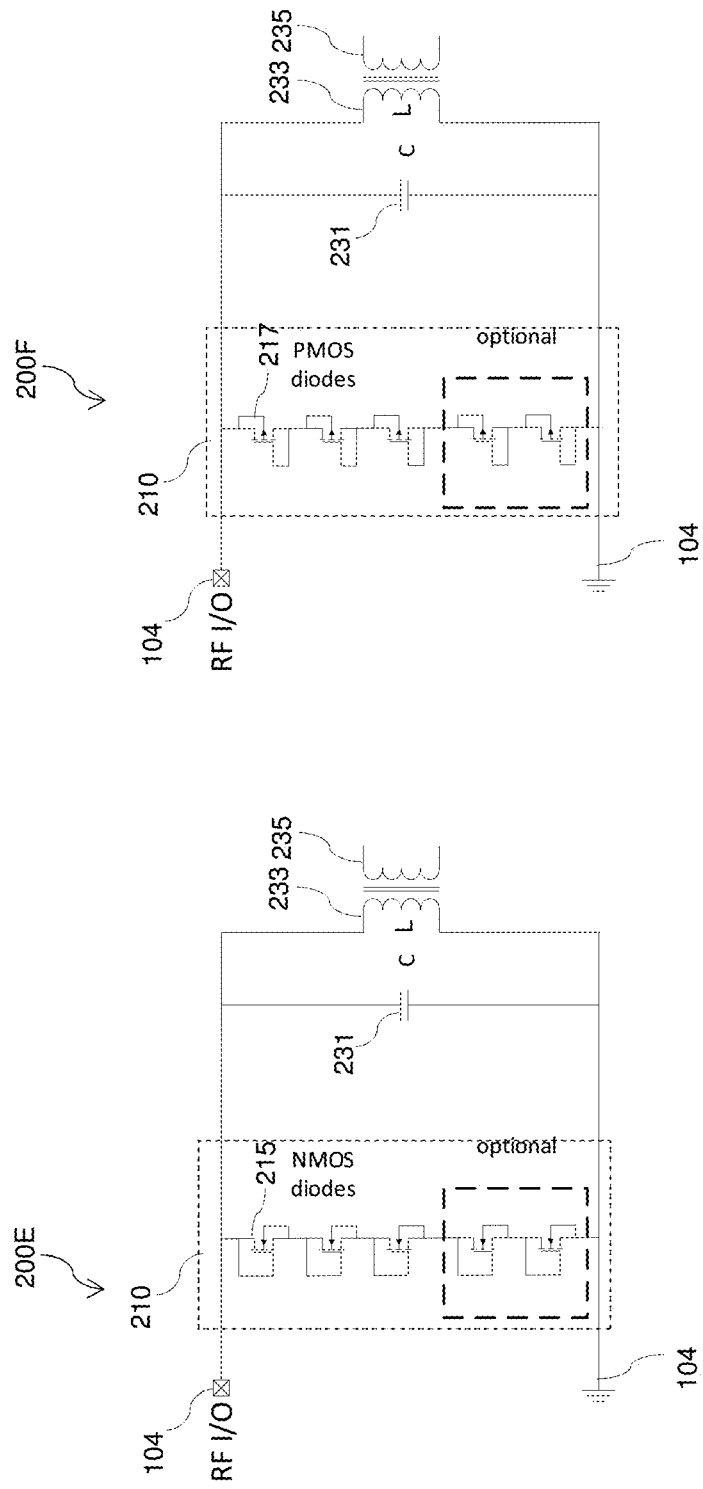

ELECTROSTATIC DISCHARGE PROTECTION FOR RF PINS

TECHNICAL FIELD

The present invention relates generally to electrostatic discharge (ESD) protection, and, in particular embodiments, to ESD protection circuits for the radio frequency input/output (RF I/O) pins of a radio frequency integrated circuit (RFIC).

BACKGROUND

Electrostatic discharge (ESD) refers to the sudden flow of electricity between two electrically charged objects caused by, e.g., contact, an electrical short, or dielectric breakdown. ESD may damage sensitive electronic devices such as integrated circuit (IC) devices. ESD events may occur during the manufacturing process of the IC device, or during the shipping and handling of the IC device after the IC device has been manufactured.

To prevent ESD damage, IC devices typically have ESD protection circuits. The ESD protection circuit is designed to provide protection against certain levels of ESD events defined in, e.g., various specifications or standards. For example, the ANSI/ESDA/JEDEC JS-001-2017 standard establishes the procedure for testing, evaluating, and classifying components and microcircuits according to their susceptibility (sensitivity) to damage or degradation by exposure to a defined Human Body Model (HBM) electrostatic discharge, which models the ESD event caused by a charged object approaching a device and discharging through the device. As another example, the ANSI/ESDA/JEDEC JS-002-2018 standard defines a Charged Device Model (CDM) electrostatic discharge, which models the ESD event caused by the device itself becoming charged (e.g., by sliding on a surface (tribocharging) or by electric field induction) and rapidly discharging (by an ESD event) as the device approaches a conductive object.

SUMMARY

In accordance with an embodiment of the present invention, a radio frequency integrated circuit (RFIC) device includes: a first RF input/output (I/O) terminal; a second RF I/O terminal, wherein the first RF I/O terminal and the second RF I/O terminal are configured to transmit or receive an RF signal; a capacitor coupled between the first RF I/O terminal and the second RF I/O terminal; a first coil coupled between the first RF I/O terminal and the second RF I/O terminal, wherein the first coil is configured to provide ESD protection to the capacitor during a first ESD event; and a fast transient ESD protection circuit coupled between the first RF I/O terminal and the second RF I/O terminal, wherein the fast transient ESD protection circuit is configured to provide ESD protection to the capacitor during a second ESD event different from the first ESD event, wherein a first rise time of a first ESD current of the first ESD event is longer than a second rise time of a second ESD current of the second ESD event.

In accordance with an embodiment of the present invention, a radio frequency integrated circuit (RFIC) device includes: a first RF input/output (I/O) pin and a second RF I/O pin that are configured to transmit or receive a first RF signal; a capacitor coupled between the first RF I/O pin and the second RF I/O pin; a first coil coupled in parallel with the capacitor, wherein the first coil is configured to provide ESD protection to the capacitor during a first ESD event, wherein the first ESD event has a first rise time for a first ESD current of the first ESD event; and a fast transient ESD protection circuit coupled in parallel with the capacitor, wherein the fast transient ESD protection circuit is configured to provide ESD protection to the capacitor during a second ESD event, wherein the second ESD event has a second rise time for a second ESD current of the second ESD event, wherein the second rise time is shorter than the first rise time, wherein the fast transient ESD protection circuit is configured to be inactive during the first ESD event and during normal operation of the RFIC device when the RFIC device is transmitting or receiving RF signals without ESD events.

In accordance with an embodiment of the present invention, a radio frequency integrated circuit (RFIC) device includes: a first RF input/output (I/O) pin and a second RF I/O pin that are configured to be coupled to an external antenna; a capacitor coupled between the first RF I/O pin and the second RF I/O pin; a transformer having a primary winding and a secondary winding, wherein terminals of the primary winding are coupled to the first RF I/O pin and the second RF I/O pin, wherein the transformer is configured to relay RF signals between the primary winding and the secondary winding during normal operation of the RFIC device; an active circuitry coupled to terminals of the secondary winding; and an ESD protection circuit coupled between the first RF I/O pin and the second RF I/O pin, wherein the primary winding of the transformer is configured to provide ESD protection to the capacitor during a first ESD event, wherein the ESD protection circuit is configured to provide ESD protection to the capacitor during a second ESD event, wherein a second rise time of the second ESD event is shorter than a first rise time of the first ESD event, wherein during the first ESD event, the primary winding conducts an ESD current of the first ESD event while the ESD protection circuit is non-conducting, wherein during the second ESD event, the ESD protection circuit conducts an ESD current of the second ESD event while the primary winding is in a high-impedance phase.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A and 4B illustrate example cross-sectional views of a shallow-trench-isolation (STI) bound pn diode and an STI bound np diode, respectively;

FIG. 8A illustrates a schematic view of an ESD protection circuit, in another embodiment;

FIG. 8B illustrates a schematic view of an ESD protection circuit, in another embodiment;

DETAILED DESCRIPTION OF ILLUSTRATIVE EMBODIMENTS

Figure 1:
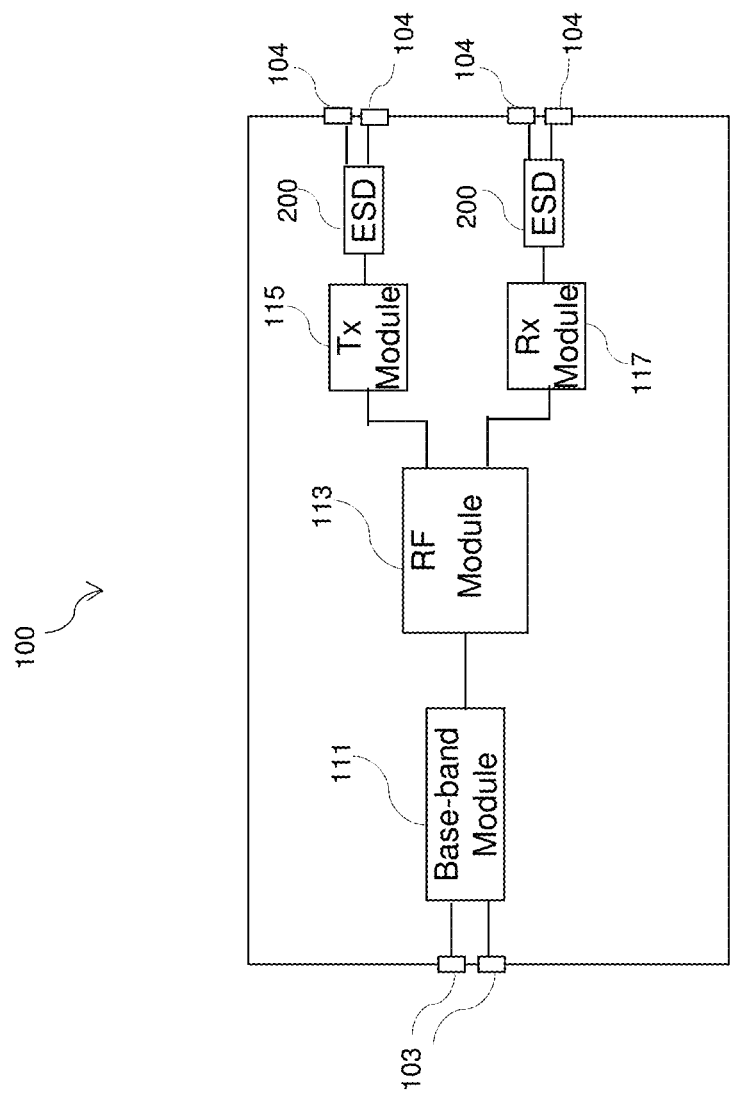
FIG. 1 illustrates a block diagram of a radio frequency integrated circuit (RFIC) device with ESD protection circuits, in an embodiment.

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Throughout the discussion herein, unless otherwise specified, the same or similar reference numeral in different figures refers to the same or similar component. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present invention will be described with respect to example embodiments in a specific context, namely RFIC device with ESD protection circuits for ESD protection of the RF I/O pins.

FIG. 1 illustrates a block diagram of a radio frequency integrated circuit (RFIC) device 100 with ESD protection circuits 200, in an embodiment. Note that for simplicity, not all functional blocks of the RFIC device 100 are illustrated in FIG. 1. In the example of FIG. 1, the RFIC device 100 includes a base-band module 111, an RF module 113, a transmit (Tx) module 115, a receive (Rx) module 117, and ESD protection circuits 200. The base-band module 111 includes circuits for performing digital base-band processing functions, such as digital filtering, digital modulation (e.g., constellation mapping), equalization, digital re-sampling, or the like. The RF module 113 includes circuits designed to handle RF signals and perform RF related functions, such as modulating the output of the base-band module 11 into an RF signal or demodulating an RF signal into a base-band signal. The RF module 113 may include RF related components such as mixers, oscillators, or the like. Depending on the design of the RFIC device 100, analog-to-digital converters (ADCs) and/or digital-to-analog converters (DACs) may be formed in the RF module 113 or in the base-band module 111. The Tx module 115 includes circuits for performing functions related with transmitting RF signals, and may include electrical components such as drivers and/or power amplifiers. The Rx module 117 include circuits for performing functions related with receiving RF signals, and may include electrical components such as analog filters, lower-noise amplifiers, or the like. In some embodiments, the RFIC device 100 includes the Tx module 115 but does not include the Rx module 117. In other embodiments, the RFIC device 100 includes the Rx module 117 and does not include the Tx module 115.

The RFIC device 100 is electrically coupled to external circuits through pins 103 and 104. The pins 103 are used for connection to external signals, e.g., power supply, digital data sent to or received by the RFIC device 100. The pins 104 are configured to be connected to external antennas (e.g., Tx antennas, or Rx antennas) for transmitting or receiving RF signals via the external antennas, and therefore, are also referred to as RF I/O pins 104. FIG. 1 further illustrates an ESD protection circuit 200 between the Tx module 115 and the RF I/O pins 104, and an ESD protection circuit 200 between the Rx module 117 and the RF I/O pins. The ESD protection circuit 200 provides ESD protection to the RFIC device 100 against HBM/CDM type ESD events and against fast transient ESD event (e.g., with rise time less than 100 ps). Details are discussed hereinafter. Note that the number of RF I/O pins 104 and the number of ESD protection circuits 200 illustrated in FIG. 1 are for illustration purpose only and are not limiting. Other numbers of RF I/O pins 104 and other numbers of ESD protection circuit 200 are also possible and are fully intended to be included within the scope of the present disclosure.

In some embodiments, the RFIC device 100 is an integrated circuit (IC) that is formed on a semiconductor substrate (e.g., a single semiconductor substrate). The semiconductor substrate of the RFIC device 100 may be, e.g., silicon, doped or un-doped, or an active layer of a semiconductor-on-insulator (SOI) substrate. The semiconductor substrate may include other semiconductor materials, such as germanium; a compound semiconductor including silicon carbide, gallium arsenide, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Electrical components, such as transistors, diodes, capacitors, resistors, etc., may be formed in and/or on the semiconductor substrate and may be interconnected by interconnect structures formed by, e.g., metallization patterns in one or more dielectric layers over the semiconductor substrate to form functional circuits of the integrated circuit.

Figure 2:
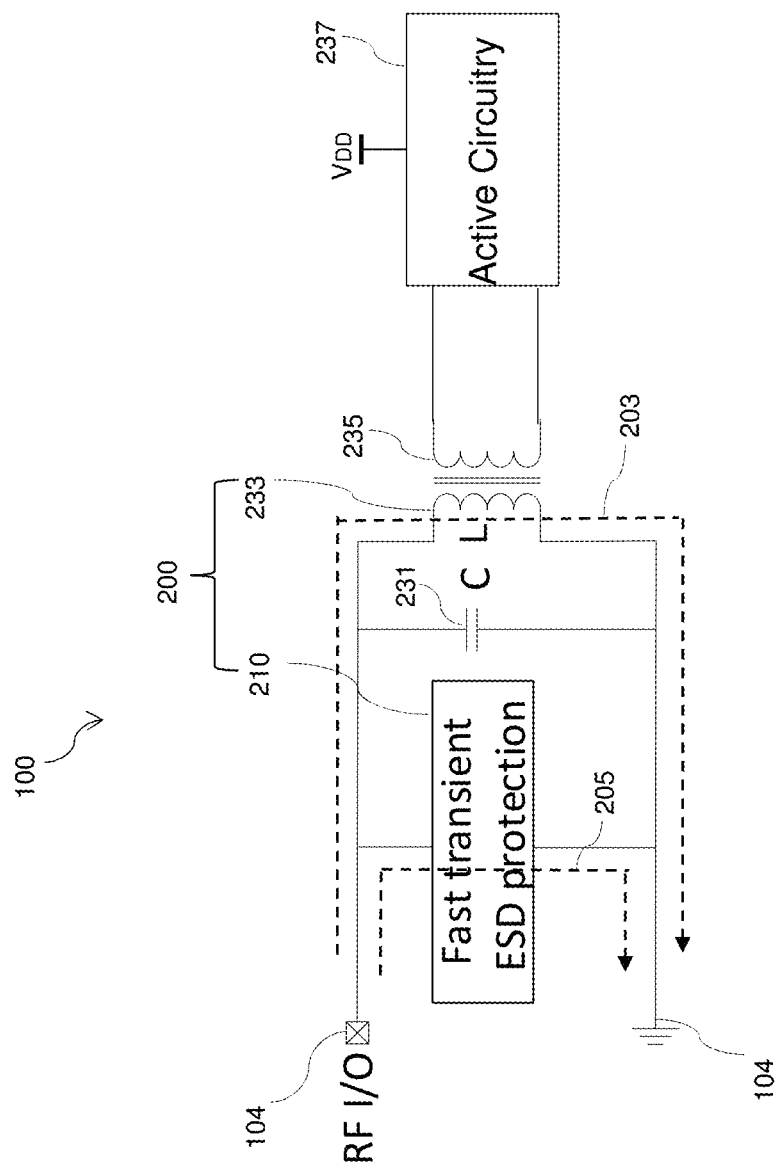
FIG. 2 illustrates a block diagram of a portion of the RFIC device of FIG. 1, in an embodiment.

FIG. 2 illustrates a block diagram of a portion of the RFIC device 100 of FIG. 1, in an embodiment. FIG. 2 shows more details of one of the ESD protection circuits 200, which includes a coil 233 (may also be referred to as a first ESD protection circuit 233) and a fast transient ESD protection circuit 210 (may also be referred to as a second ESD protection circuit 210). FIG. 2 further illustrates some of the components (e.g., capacitor 231, coil 235) and circuitries (e.g., 237) of the RFIC device 100 that are functionally coupled to the ESD protection circuit 200.

As illustrated in FIG. 2, the coil 233 (may also be referred to as an inductor 233) is coupled between a pair of RF I/O pins 104 which are configured to be connected to an external antenna. In the example of FIG. 2, the RF signal from the RF antenna is a single-ended signal, the lower RF I/O pin 104 is connected to a reference voltage (e.g., electrical ground), and the upper RF I/O pin 104 is connected to the RF signal from the external antenna. The upper RF I/O pin 104 may be connected directly to the external antenna, or may be connected to the external antenna through an RF filter or an RF circulator.

The coil 233 is inductively coupled to a coil 235 (may also be referred to as an inductor 235) for relaying RF signals between the coil 233 and the coil 235. In other words, the coil 233 and the coil 235 function as a transformer, such that when the RF I/O pins 104 are receiving a first RF signal, the received first RF signal at the RF I/O pins 104 is inductively transferred to the coil 235 as a second RF signal (which is proportional to the first RF signal) for processing by the active circuitry 237 of the RFIC device 100. Conversely, when the RF I/O pins 104 are used for transmitting RF signals, a first RF signal generated by the active circuitry 237 is conductively coupled to the coil 233 as a second RF signal (which is proportional to the first RF signal) such that the second RF signal are available for transmission at the RF I/O pins 104. The winding ratio between the coil 233 (may also be referred to as a primary winding) and the coil 235 (may also be referred to as a secondary winding) may be 1:1, or 1:n (n≠1). As a non-limiting example, the coil 233 and the coil 235 may be the same (e.g., having a 1:1 winding ratio) and have a same inductance of L. The active circuitry 237 in FIG. 2 includes some or all of the based-band module 11, the RF module 113, the Tx module 115, and the Rx module 117. Note that unlike the ESD protection circuit 200 (which is not connected to a voltage supply), the active circuitry 237 is connected to at least one voltage supply, such as a voltage source providing a voltage of $V_{DD}$.

In FIG. 2, a capacitor 231 is coupled in parallel with the coil 233. In an example embodiment, the capacitor 231 is a metal-insulator-metal (MIM) type of capacitor. In some embodiments, the capacitor 231 and the coil 233 form a parallel resonance circuit. In some embodiments, the capacitance C of the capacitor 231 and the inductance L of the coil 233 are chosen to determine the resonance frequency f of the parallel resonance circuit, which is chosen to be within the frequency range of the RF signals the RFIC device 100 is designed to process. For example, the RF signals at the RF I/O pins 130R have frequencies in the 5 GHz~20 GHz frequency range, the capacitance C of the capacitor 231 is in a range between 0.1 pF and 3 pF, and the inductance L of the coil 233 is in a range between 0.5 nH and 4 nH.

For RFIC devices working with RF signals in the, e.g., 5 GHz~20 GHz frequency range, the RF I/O pins of the RFIC devices are very sensitive to parasitic capacitance. Therefore, conventional low-capacitance ESD circuits cannot be used for ESD protection of these RF I/O pins. To reduce parasitic capacitance at the RF I/O pins 104, the RF I/O pins 104 are designed as self-protecting against ESD events using parallel resonance circuits. For example, during HBM or CDM ESD events, the coil 233 of the parallel resonance circuit represents a low impedance path to electrical ground and protects the capacitor 231 by clamping the voltage across the capacitor 231 to a low voltage. Therefore, the coil 233 is also referred to as a first ESD protection circuit of the RFIC device 100 in the discussion herein. The dashed path 203 in FIG. 2 illustrates an example ESD current flow path during the HBM or CDM ESD events. For example, during an HBM ESD event, the impedance of the coil 233 may be less than 5Ω, and voltage across the capacitor 231 may be clamped to less than 10 V. During a CDM ESD event, the impedance of the coil 233 may be less than 30Ω, and the voltage across the capacitor 231 may be clamped to less than 50 V.

Note that the rise time of the ESD current for the HBM or CDM ESD events are relatively long. For example, an HBM event may have a rise time between 2 ns and 10 ns, and a CDM event may have a rise time at about 100 ps. During handling of the RFIC chips, e.g., at the backend processing of the manufacturing process, fast transient ESD events with rise time less than 100 ps (e.g., between 10 ps and 100 ps) may be generated, despite voltage control measures being used in the backend process to avoid ESD events. ESD protection circuits designed to handle the HBM/CDM ESD events may not be able to handle the fast transient ESD events. For example, during the fast transient ESD events, the inductance of the coil 233 of the parallel resonance circuit may be much higher (e.g., higher than 150Ω) than that during the HBM/CDM ESD events, thus representing a high impedance path to electrical ground. If the ESD protection circuit 200 does not have the fast transient ESD protection circuit 210, the high impedance path of the coil 233 would result in a large voltage (e.g., much higher than 50 V) overshoot which may degrade or damage the capacitor 231.

To provide ESD protection during the fast transient ESD events, the ESD protection circuit 200 includes the fast transient ESD protection circuit 210. The fast transient ESD protection circuit 210 is designed to be inactive (e.g., be turned off, or not conducting electrical current) during HBM/CDM ESD events, or during normal operation when the RFIC device 100 is working (e.g., transmitting or receiving RF signals) without an ESD event. The fast transient ESD protection circuit 210 is designed to be active (e.g., turned on, or conducting ESD current) only during the fast transient ESD events, in which case the fast transient ESD protection circuit 210 is turned on and clamps the voltage at the RF I/O pins 104 at a low level. The dashed current path 205 in FIG. 2 illustrates an example ESD current path during a fast transient ESD event. In other words, during HBM/CDM ESD events, the coil 233 (the first ESD protection circuit) is in low impedance phase and clamps the ESD voltage, the ESD current flows through the coil 233, and no ESD current flows through the fast transient ESD protection circuit 210 (which is inactive during the HBM/CDM ESD events); during fast transient ESD events, the coil 233 is in high-impedance phase, the fast transient ESD protection circuit 210 is now active (e.g., in low-impedance phase) and clamps the ESD voltage, the ESD current flows through the fast transient ESD protection circuit 210 (which provides a low-impedance path to the electrical ground), and no significant ESD current flows through the coil 233 (due to its high-impedance phase). For example, during the fast transient ESD events, most (e.g., over 50%) of the ESD current flows through the fast transient ESD protection circuit 210, and a small portion (e.g., less than 50%) of the ESD current flows through the parallel resonance circuit. During the fast transient ESD events, the amount (e.g. percentage) of the ESD current flowing through the fast transient ESD protection circuit 210 increases as the rise time of the ESD event decreases. In other words, during the fast transient ESD events, shorter rise time of the ESD event results in a higher percentage of the ESD current flowing through the fast transient ESD protection circuit 210.

Various embodiments of the fast transient ESD protection circuit 210 are discussed hereinafter. Note that as discussed below, the structure/design of the fast transient ESD protection circuit 210 allows it to be made very small (e.g., having small physical size, such as less than 507 μm$^2$), having very low parasitic capacitance (e.g., between 10 fF and 100 fF) and parasitic inductance (e.g., less than 100 pH), and have very quick reaction time (e.g., less than 50 ps). These features, coupled with the fact that the fast transient ESD protection circuit 210 is inactive (thus consuming no additional power) during normal operation, enables a low-cost and robust ESD protection (e.g., the ESD protection circuit 200) against both HBM/CDM ESD events and fast transient ESD events. Note that the capacitor 231 in FIG. 2 is used as a non-limiting example of the components protected by the ESD protection circuit 200, with the understanding that the ESD protection circuit 200 may provide ESD protection to other components connected to the RF I/O pins 104.

Figure 3B:
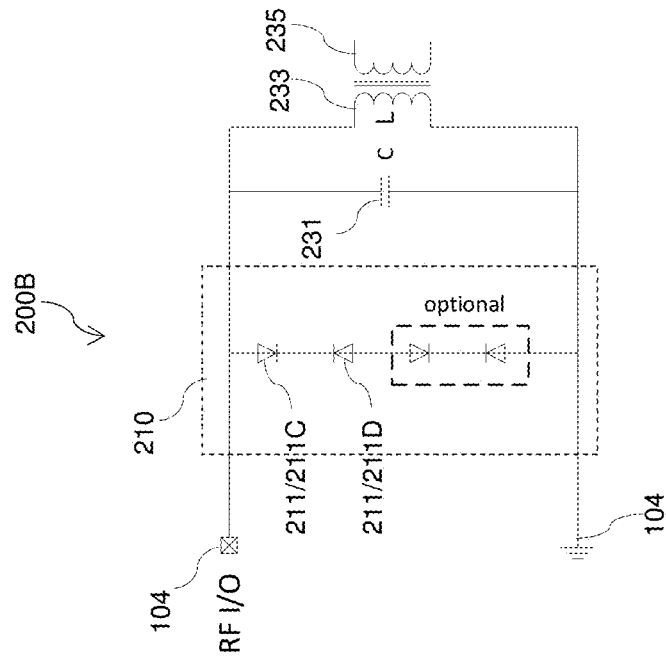
FIG. 3B illustrates a schematic view of an ESD protection circuit, in another embodiment.
Figure 3A:
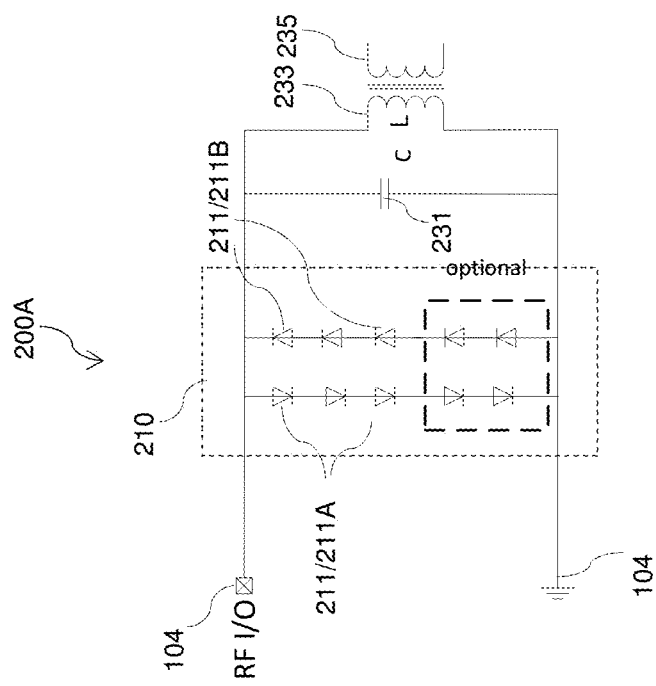
FIG. 3A illustrates a schematic view of an ESD protection circuit, in an embodiment.

FIG. 3A illustrates a schematic view of an ESD protection circuit 200A, in an embodiment. The ESD protection circuit 200A may be used as the ESD protection circuit 200 in FIG. 2. To better illustrate the electrical connection between the ESD protection circuit 200A and other components of the RFIC device 100, additional components, such as the capacitor 231 and the coil 235, are also illustrated in FIG. 3A.

In FIG. 3A, the fast transient ESD protection circuit 210 is implemented as a plurality of diodes 211A coupled in series between the RF I/O pins 104 and a plurality of diodes 211B coupled in series between the RF I/O pins 104. In particular, the forward bias directions of the diodes 211A are along a first direction (e.g., downward direction in FIG. 3A), and the forward bias directions of the diodes 211B are along a second direction (e.g., upward direction in FIG. 3A) opposite to the first direction to achieve bi-directional over-voltage protection. In the illustrated embodiment, the diodes 211A and 211B are the same, and may be referred to collectively as diodes 211. The number of diodes 211A and the number of diodes 211B in the fast transient ESD protection circuit 210 is determined by the expected RF voltage at the RF I/O pins 104.

The configuration of the diodes 211 in FIG. 3A (e.g., coupled in series) is suitable for RF signals with small signal amplitude (e.g., less than 2.5 V or 2V). For RF signals with large amplitude (e.g., larger than 5V, 10V, or 15V), diodes in anti-series configuration (see, e.g., FIG. 3B) is more suitable. For example, if the RF signal voltage is up to about 0.4 V, then three diodes 211A and three diodes 211B in forward bias mode may form the fast transient ESD protection circuit 210 with a turn on voltage of about 1.5 V, which provides enough margin (e.g., separation) from the RF signal amplitude such that the fast transient ESD protection circuit 210 is inactive during normal operation (e.g., when there is no ESD event and the RFIC device 100 is transmitting or receiving RF signals). Therefore, during the normal operation mode, an RF current flows through the coil 233 while no electrical current flows through the fast transient ESD protection circuit 210. In an example embodiment, the diodes 211 in FIG. 3A are Shallow Trench Isolation (STI) bound pn diodes or STI bound np diodes, which have very quick turn on time (e.g., <150 ps), such that during the fast transient ESD events, the diodes 211A (or 211B) are turned on to form a low-impedance path to electrical ground for the ESD current to flow through, thereby protecting the capacitor 231. As illustrated in FIG. 3A, additional diodes 2 nA and 2 nB, such as those illustrated in the dashed box labeled "optional," may optionally be added to adjust the turn on voltage of the fast transient ESD protection circuit 210.

FIG. 3B illustrates a schematic view of an ESD protection circuit 200B, in another embodiment. The ESD protection circuit 200B may be used as the ESD protection circuit 200 in FIG. 2. In FIG. 3B, the fast transient ESD protection circuit 210 includes a diode 211C and a diode 211D connected in the anti-series configuration, where the forward bias directions of the diode 211C and the diode 211D are opposite to each other. The diodes 211C and 211D are the same type of diodes and may be collectively referred to as diodes 211. The diodes 211 may be STI bound np diodes or STI bound pn diodes. The fast transient ESD protection circuit 210 have a high breakdown voltage (e.g., about 13 V) and is suitable for RF signal with high voltages (e.g., about 10 V). The high breakdown voltage ensures that no current flows through the fast transient ESD protection circuit 210 during normal operation. When a fast transient ESD event happens, the high ESD voltage causes breakdown of one of the diodes 211, and the other diode 211 is forward biased, and a low impedance path to electrical ground is formed to allow the ESD current to flow through. The dashed box labeled "optional" in FIG. 3B illustrates additional diodes in anti-series configuration, which may be added to adjust (e.g., increase) the breakdown voltage of the fast transient ESD protection circuit 210.

FIG. 4A illustrates a cross-sectional view of an STI bound pn diode 300A, in an embodiment. In FIG. 4A, an n-well NW is formed in a semiconductor substrate 301, e.g., by doping the semiconductor substrate 301 with an n-type dopant such as arsenic, phosphorous, or the like. The n-well NW is surrounded by p-well regions PW that are formed by doping the semiconductor substrate 301 with a p-type dopant such as boron. A heavily doped p-type region 305 and a heavily doped n-type region 303 are formed in the n-well NW. A shallow trench isolation (STI) region 307 is formed between the heavily doped p-type region 305 and the heavily doped n-type region 303. The STI region 307 may be formed by removing a portion of the semiconductor substrate 301 to form a recess (e.g., opening), then filling the recess with a dielectric material such as silicon oxide. The heavily doped p-type region 305 and the heavily doped n-type region 303 in the n-well NW form the STI bound pn diode. Contact pads or connectors may be formed over the heavily doped p-type region 305 and the heavily doped n-type region 303 as the terminals of the STI bound pn diode. FIG. 4A further illustrates doped p-type regions formed in the p-well regions PW, and STI regions 307 between the n-well NW and the p-well regions PW. In some embodiments, the semiconductor substrate 301 is the same substrate for forming the RFIC device 100. Note that since the fast transient ESD protection circuit 210 is designed to handle ESD event with a quick rise time (e.g., <100 ps), a short duration (e.g., about 1 ns), and a low ESD energy, the diodes (e.g., STI bound pn diodes or STI bound np diodes) can be made very small, thereby having negligible parasitic capacitance and negligible impact on the size and power consumption of the RFIC device 100.

FIG. 4B illustrates a cross-sectional view of an STI bound np diode 300B, in an embodiment. The STI bound np diode 300B is similar to the STI bound pn diode 300A of FIG. 4A, but with a heavily doped n-type region 303 and a heavily doped p-type region 305 formed in a p-well PW. FIG. 4B further illustrates n-well regions NW around the p-well PW, and STI regions 307. The heavily doped n-type region 303 and the heavily doped p-type region 305 in the p-well PW form the STI bound np diode. Contact pads or connectors may be formed over the heavily doped n-type region 303 and the heavily doped p-type region 305 as the terminals of the STI bound np diode. Details are the same as or similar to those of FIG. 3A, thus not repeated.

Figure 5B:
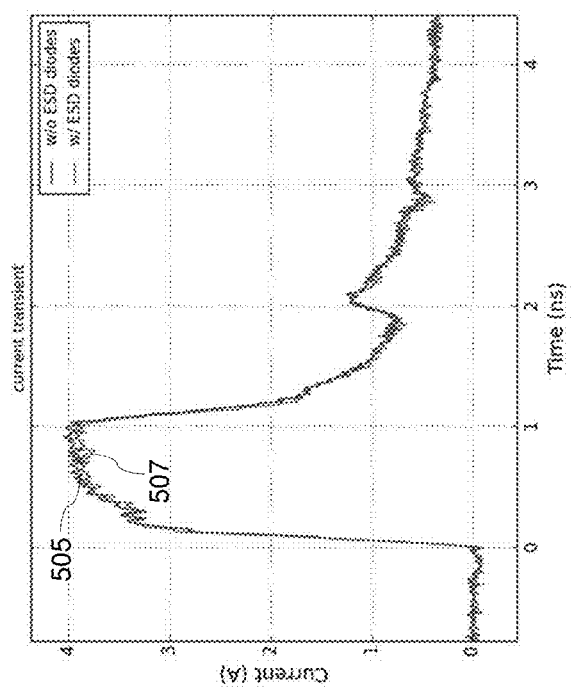
FIGS. 5A and 5B illustrate the voltage response and the current response, respectively, of an RFIC device during a fast transient ESD event, in some embodiments.
Figure 5A:
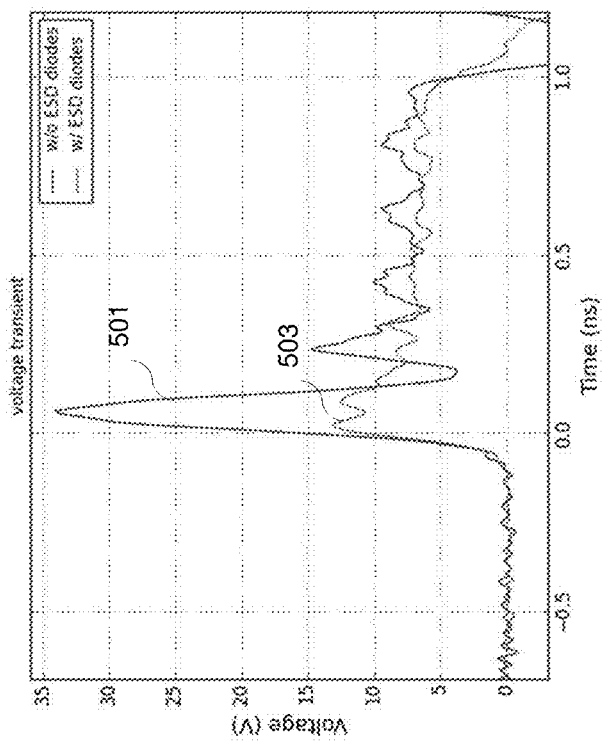

FIGS. 5A and 5B illustrate the voltage response and the current response, respectively, of the ESD protection circuit 200A in FIG. 3A to a fast transient ESD event, in some embodiments. Specifically, the curve 503 in FIG. 5A and the curve 507 in FIG. 5B illustrate the voltage response and the current response, respectively, of the ESD protection circuit 200A. For comparison purpose, the curve 501 in FIG. 5A and the curve 505 in FIG. 5B illustrate the voltage response and the current response, respectively, of a reference design which is similar to the ESD protection circuit 200A of FIG. 3A, but with the fast transient ESD protection circuit 210 removed.

It is seen from FIG. 5A that when the fast transient ESD event happens at around time t=0 ns, the fast transient ESD protection circuit 210 effectively clamps the voltage at the RF I/O pins to below 15 V. In comparison, the reference design, without the benefit of the fast transient ESD protection circuit 210, is not able to provide effective ESD protection, and the voltage at the RF I/O pins rises to almost 35 V, which may damage, e.g., the capacitor 231 in FIG. 3A. Note that the current response between the curves 505 and 507 in FIG. 5B are similar.

Figure 6B:
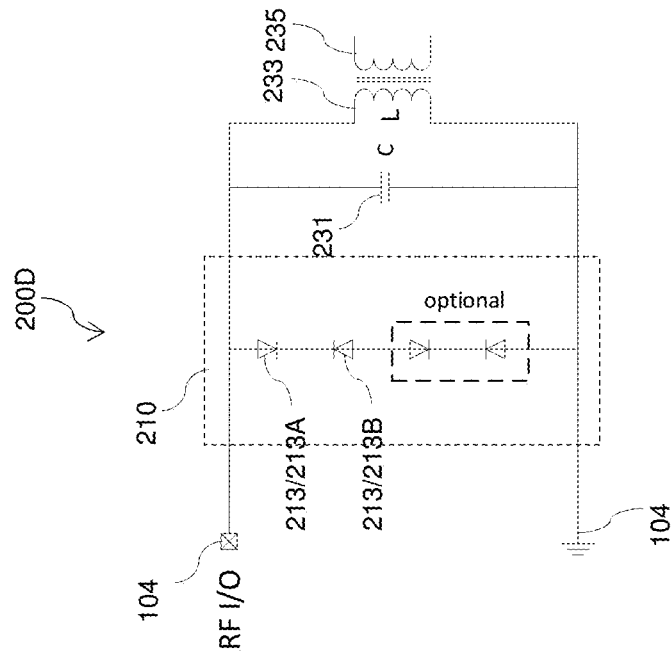
FIG. 6B illustrates a schematic view of an ESD protection circuit, in another embodiment.
Figure 6A:
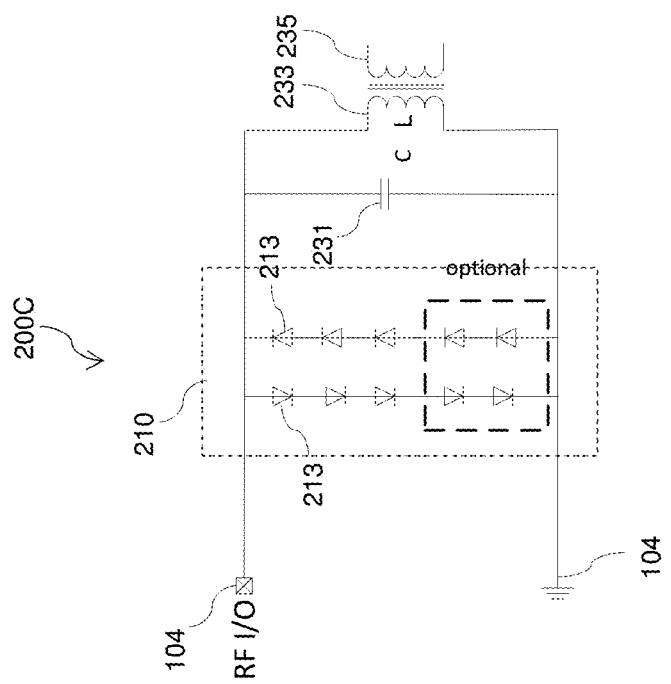
FIG. 6A illustrates a schematic view of an ESD protection circuit, in another embodiment.

FIG. 6A illustrates a schematic view of an ESD protection circuit 200C, in another embodiment. The ESD protection circuit 200C may be used as the ESD protection circuit 200 in FIG. 2. The ESD protection circuit 200C is similar to the ESD protection circuit 200A in FIG. 3A, but with the diodes 213 in the fast transient ESD protection circuit 210 of FIG. 6A being implemented as no-STI bound pn diodes or no-STI bound np diodes. The no-STI bound pn diodes and the no-STI bound np diodes have very fast turn on time, such as less than about 100 ps, in some embodiments. The structure and working principle of the fast transient ESD protection circuit 210 in FIG. 6A is the same as or similar to that in FIG. 3A, thus details are not repeated. Details of no-STI bound pn diodes and no-STI bound np diodes are discussed below with reference to FIGS. 7A and 7B.

FIG. 6B illustrates a schematic view of an ESD protection circuit 200D, in another embodiment. The ESD protection circuit 200D may be used as the ESD protection circuit 200 in FIG. 2. The ESD protection circuit 200D is similar to the ESD protection circuit 200B in FIG. 3B, but with the diodes 213 in the fast transient ESD protection circuit 210 of FIG. 6B implemented as no-STI bound pn diodes or no-STI bound np diodes. The structure and working principle of the transient ESD protection circuit 210 in FIG. 6B is the same as or similar to that in FIG. 3B, thus details are not repeated.

Figure 7B:
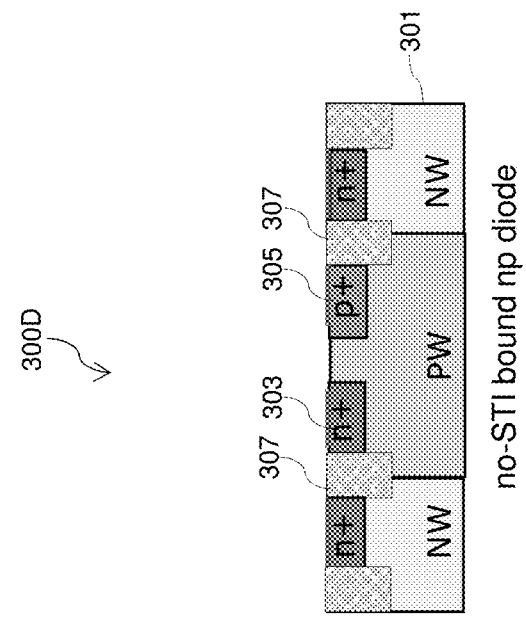
FIGS. 7A and 7B illustrate example cross-sectional views of a no-STI bound pn diode and a no-STI bound np diode, respectively.
Figure 7A:
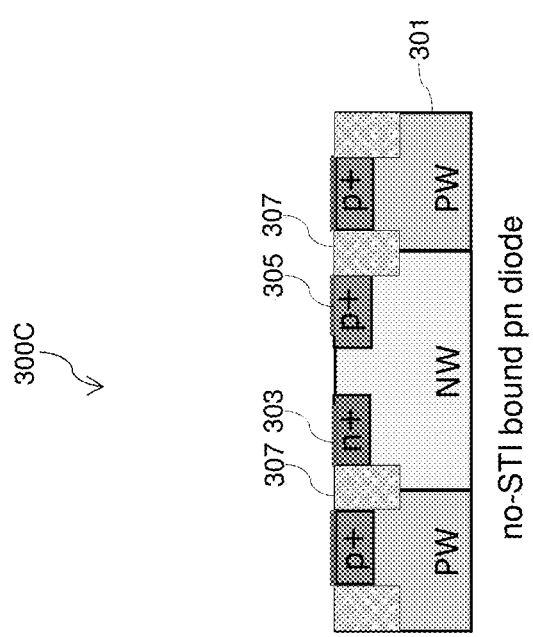

FIGS. 7A and 7B illustrate example cross-sectional views of a no-STI bound pn diode 300C and a no-STI bound np diode 300D, respectively. The no-STI bound pn diode 300C is similar to the STI bound pn diode 300A of FIG. 4A, but without the STI region 307 between the heavily doped n-type region 303 and the highly doped p-type region 305, which may improve (e.g., reduce) the turn on time of the diode formed. Similarly, the no-STI bound np diode 300D is similar to the STI bound np diode 300B of FIG. 4B, but without the STI region 307 between the heavily doped n-type region 303 and the heavily doped p-type region 305.

Figure 7C:
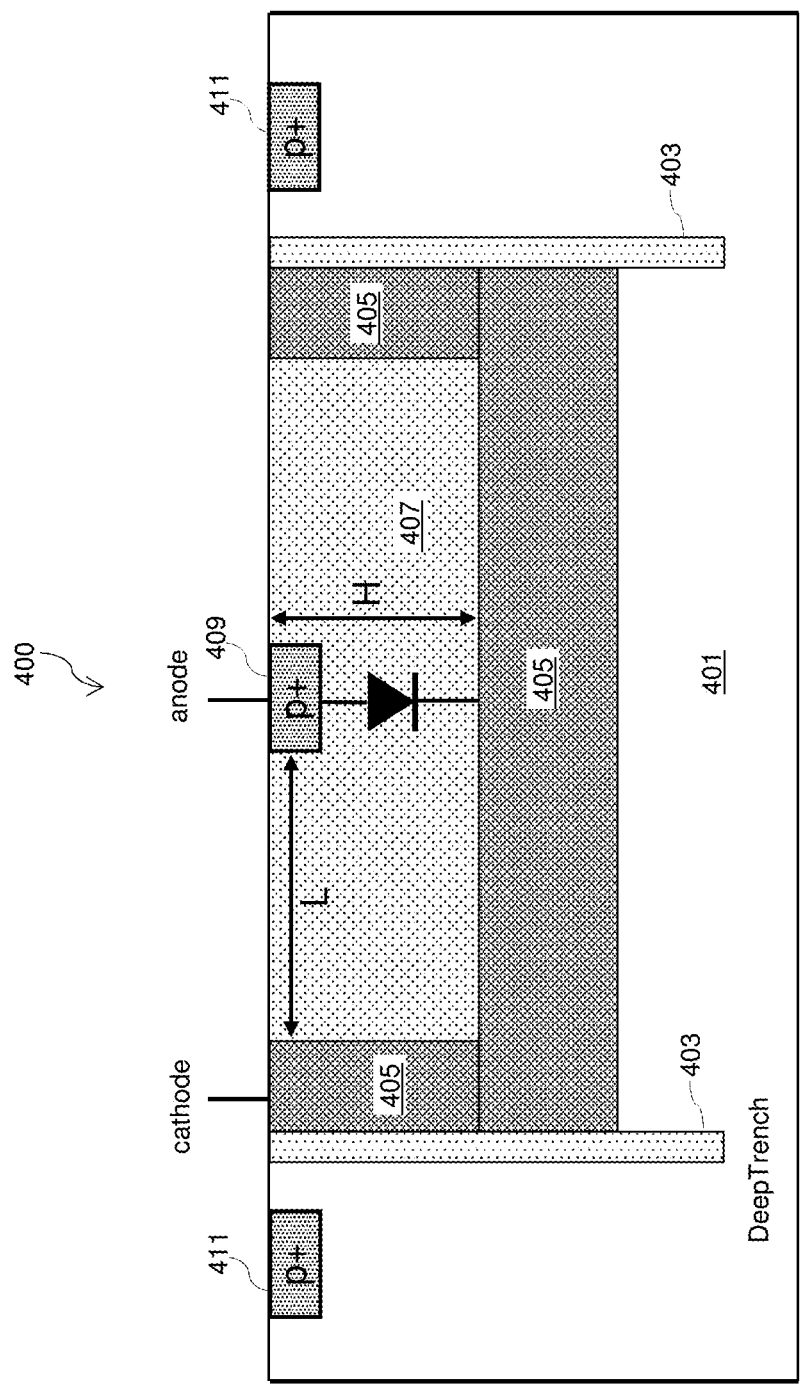
FIG. 7C illustrates a cross-sectional view of a diode for ESD protection, in an embodiment.

FIG. 7C illustrates a cross-sectional view of a diode 400 for ESD protection, in an embodiment. The diode 400 has a vertical structure, and may be used as the diodes in the fast transient ESD protection circuit 210. For example, the diode 400 may be used to replace the diode 211 in FIGS. 3A and 3B, or the diode 213 in FIGS. 6A and 6B. In FIG. 7C, the diode 400 includes a substrate 401, which may be or include a doped substrate, such as a p-type substrate. Isolation trenches 403 (also referred to as deep trenches), which are formed of a dielectric material(s) such as silicon oxide, extend into the substrate 401. A heavily doped n buried layer 405 is formed in the substrate 401 between the isolation trenches 403. A moderately n doped epitaxial layer 407 is formed over the heavily doped n buried layer 405 and extends to the upper surface of the substrate 401. A heavily doped p+ diffusion region 409 is formed in the moderately n doped epitaxial layer 407 at the upper surface of the substrate 401, and serves as the anode of the diode 400. As illustrated in FIG. 7C, portions of the heavily doped n buried layer 405 extends upward along the isolation trenches 403 toward the upper surface of the substrate 401, and surrounds the moderately n doped epitaxial layer 407. These upward extending portions of the heavily doped n buried layer 405 serve as the n-sinker and/or the cathode of the diode 400. A diode is formed between the heavily doped p+ diffusion region 409 and heavily doped n buried layer 405, as illustrated by the diode symbol in FIG. 7C. In an example embodiment, a depth H of the moderately n doped epitaxial layer 407 is about 0.5 μm, and a lateral distance L between the upward extending portions of the heavily doped n buried layer 405 and the heavily doped p+ diffusion region 409 is about 1.17 μm. FIG. 7C further illustrates heavily doped p+ diffusion regions 411 at the upper surface of the substrate 401, which serves as the substrate contacts of the diode 400. The turn on time of the diode 400 is between the turn on time of the no-STI bound diodes and the STI bound diodes, in some embodiments.

FIGS. 8A and 8B illustrate schematic views of ESD protection circuits 200E and 200F, respectively, in some embodiments. The ESD protection circuit 200E or 200F may be used as the ESD protection circuit 200 in FIG. 2. In FIG. 8A, the fast transient ESD protection circuit 210 includes a plurality of NMOS diodes 215 coupled in series between the RF I/O pins 104. In FIG. 8B, the fast transient ESD protection circuit 210 includes a plurality of PMOS diodes 217 coupled in series between the RF I/O pins 104. For ease of discussion, the term MOS diode may be used to describe an NMOS diodes (e.g., 215) or a PMOS diodes (e.g., 217). In the illustrated embodiments, each of the MOS diodes (e.g., 215 or 217) is formed by connecting the gate of a MOS transistor (e.g., an NMOS transistor, or a PMOS transistor) to the drain of the MOS transistor, and by connecting the source of the MOS transistor to the body (may also be referred to as the bulk) of the MOS transistor.

In the example of FIG. 8A or FIG. 8B, the turn on voltage of the fast transient ESD protection circuit 210 is determined by the number of MOS diodes (e.g., 215, or 217) coupled in series and by the threshold voltage of each MOS diode (or the turn on voltage of the forward biased MOS diode). Therefore, the number of the MOS diodes in FIGS. 8A and 8B may be adjusted in accordance to the expected voltage range of the RF signal, details are similar to those discussed above with reference to FIG. 3A, thus not repeated. Skilled artisans will readily appreciate that the fast transient ESD protection circuit 210 in FIGS. 8A and 8B provide bi-directional over-voltage protection.

Figure 9:
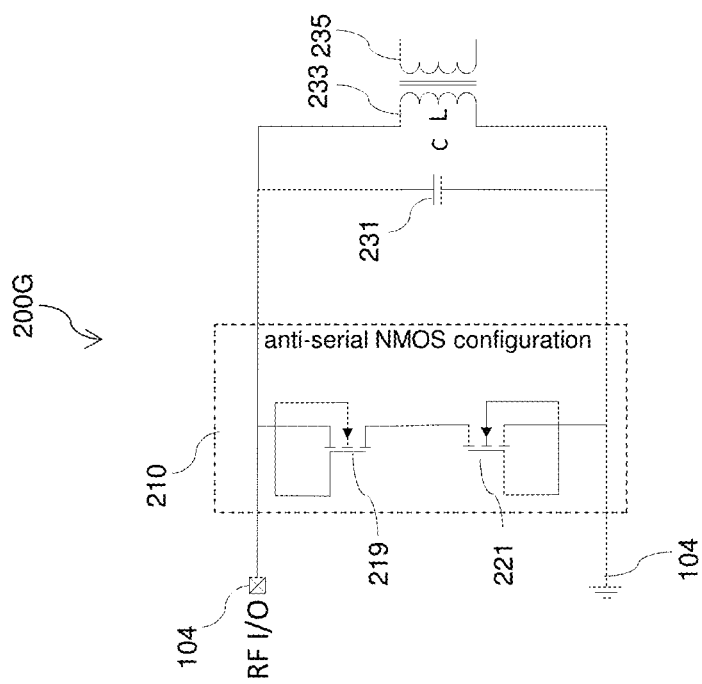
FIG. 9 illustrates a schematic view of an ESD protection circuit, in another embodiment.

FIG. 9 illustrates a schematic view of an ESD protection circuit 200G, in another embodiment. The ESD protection circuit 200G may be used as the ESD protection circuit 200 in FIG. 2. In FIG. 9, the fast transient ESD protection circuit 210 includes an NMOS diode 219 coupled in series with a gate-grounded NMOS (ggNMOS) transistor 221 to form an anti-series NMOS configuration. The NMOS diode 219 is formed by connecting the gate and the drain of an NMOS transistor to the body of the NMOS transistor. The ggNMOS transistor 221 (also referred to as ggNMOS 221) is formed by connecting the gate and the source of an NMOS transistor to the body of the NMOS transistor. In some embodiments, the gate, the source, and the body of the ggNMOS 221 are coupled to electrical ground. For a positive ESD transient voltage on the upper RF I/O pin 104, the NMOS diode 219 operates as a forward biased diode, and the ggNMOS transistor 221 operates in a parasitic npn operation mode. For a negative ESD transient voltage on the upper RF I/O pin 104, the NMOS diode 219 operates in the parasitic npn operation mode, and the ggNMOS transistor 221 operates as a forward biased diode. The turn on voltage of the fast transient ESD protection circuit 210 in FIG. 9 is determined by the transient turn on voltage of the ggNMOS 221 and the threshold voltage of the forward biased NMOS diode 219. Skilled artisans will readily appreciate that the fast transient ESD protection circuit 210 in FIG. 9 provides bi-directional over-voltage protection.

Figure 10:
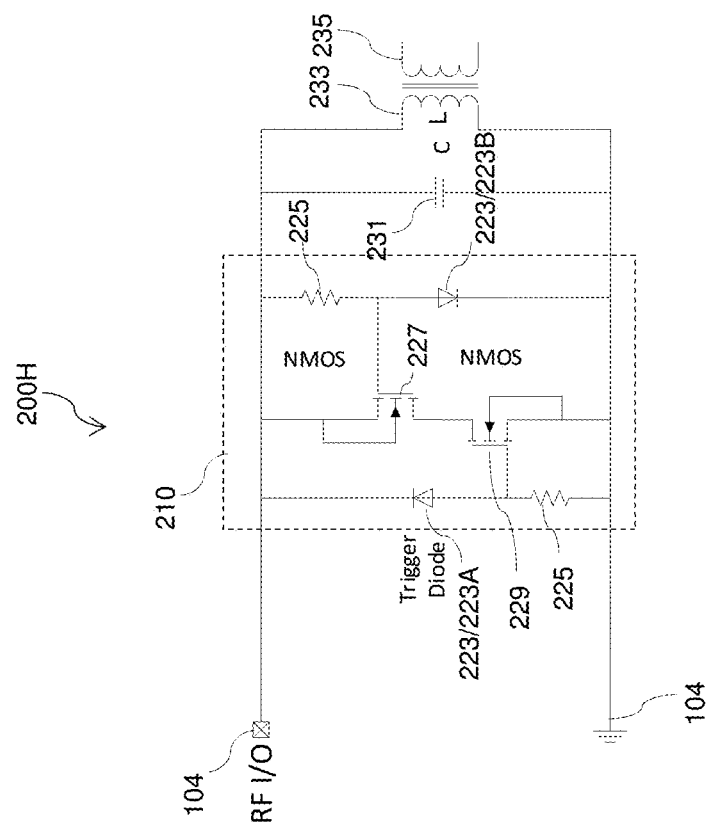
FIG. 10 illustrates a schematic view of an ESD protection circuit, in another embodiment.

FIG. 10 illustrates a schematic view of an ESD protection circuit 200H, in yet another embodiment. The ESD protection circuit 200H may be used as the ESD protection circuit 200 in FIG. 2. In FIG. 10, the fast transient ESD protection circuit 210 includes an NMOS transistor 227 and an NMOS transistor 229 coupled in an anti-series configuration between the RF I/O pins 104. FIG. 10 further illustrates diodes 223 (e.g., 223A and 223B) and resistors 225. To facilitate discussion, the diode 223 on the left of FIG. 10 is also referred to as diode 223A, and the diode 223 on the right of FIG. 10 is also referred to as diode 223B. In the illustrated embodiment, the diodes 223A and 223B are the same. In the example of FIG. 10, the drain of the NMOS transistor 227 is coupled to the drain of the NMOS transistor 229, the source of the NMOS transistor 227 is coupled to one of the RF I/O pins 104, and the source of the NMOS transistor 229 is coupled to another RF I/O pin 104. The fast transient ESD protection circuit 210 further includes a first trigger circuit for the NMOS transistor 229 that includes a diode 223A (also referred to as a trigger diode) and a resistor 225 coupled in series between the RF I/O pins 104, where the cathode of the diode 223A is connected to the upper RF I/O pin 104 in FIG. 10, and the gate of the NMOS transistor 229 is connected to a node between the diode 223A and the resistor 225. In addition, the fast transient ESD protection circuit 210 includes a second trigger circuit for the NMOS transistor 227 that includes a diode 223B (also referred to as a trigger diode) and a resistor 225 coupled in series between the RF I/O pins 104, where the cathode of the diode 223B is connected to the lower RF I/O pin 104 in FIG. 10, and the gate of the NMOS transistor 227 is connected to a node between the diode 223B and the resistor 225. In other words, the forward bias directions of the diodes 223A and 223B are opposite to each other.

Still referring to FIG. 10, in some embodiments, the turn on voltage of the fast transient ESD protection circuit 210 is determined by the breakdown voltage of the diode 223. The breakdown voltage of the diode 223 is chosen in accordance with the expected voltage range of the RF signals to provide enough margin (e.g., separation) from the RF signal amplitude, is chosen to be at a pre-determined level (e.g., 1V or 15V) to protect the capacitor 231 during a fast transient ESD event. For example, during normal operation, when there is no ESD event and the RFIC device 100 is transmitting or receiving RF signals, the first trigger circuit and the second trigger circuit are both non-conducting, since the voltage (e.g., 0.4 V) of the RF signal is below the forward bias voltage drop of the diodes 223. The NMOS transistor 227 functions as a diode, the NMOS transistor 229 functions as an "on-off" switch and is turned off during normal operation, and therefore, there is no current flowing through the NMOS transistors 227 and 229. During a fast transient ESD event, the diode 223A, which is reversely biased, breaks down and clamps the voltage at the RF I/O pin 104. The NMOS transistor 229 is now turned on, and the ESD current flows through the gate of the NMOS transistor 229 to the source of the NMOS transistor 229, thus providing a low impedance path to electrical ground for the ESD current.

The RF input signal at the RF I/O pins 104 in the previous examples of the ESD protection circuit 200 is a single ended signal. This is, of course, merely a non-limiting example. The disclosed embodiments can be readily modified to accommodate differential RF signals, as skilled artisans readily appreciate. An example is given in FIG. 11.

Figure 11:
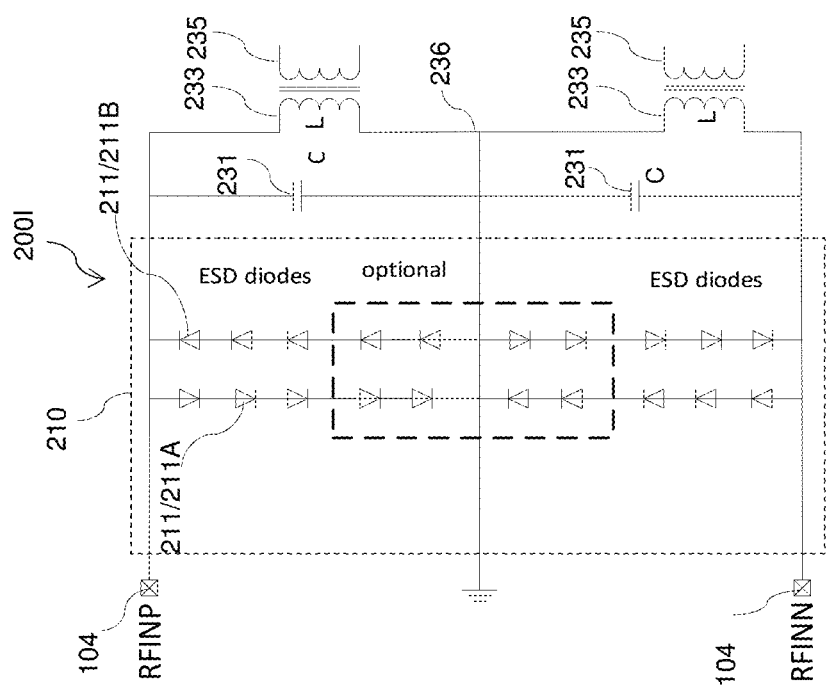
FIG. 11 illustrates a schematic view of an ESD protection circuit, in yet another embodiment.

FIG. 11 illustrates a schematic view of an ESD protection circuit 200I that is configured to be coupled to differential RF signals at RF I/O pins 104, in an embodiment. The ESD protection circuit 200I is similar to the ESD protection circuit 200A in FIG. 3A, but modified to accommodate differential RF signals. As illustrated in FIG. 11, to accommodate differential RF signals, two pairs of coils, each comprising a coil 233 inductively coupled with a respective coil 235, are used, with a node 236 between the coils 233 coupled to the reference voltage (e.g., electrical ground). In the example of FIG. 3, the dashed box labeled as "optional" shows diodes 211 connected in anti-series configuration, which are optional and may be used to increase the turn on voltage of the fast transient ESD protection circuit 210 for RF signals with large signal amplitude. Details are the same as or similar to those discussed above with reference to FIG. 3B, thus not repeated.

Embodiments may achieve advantages. For example, the ESD protection circuit 200 has a first ESD protection circuit (e.g., 233) and a second ESD protection circuit (e.g., 210). The first ESD protection circuit is configured to provide ESD protection during HBM/CDM ESD events, and the second ESD protection circuit is configured to provide ESD protection during fast transient ESD events. The second ESD protection circuit is active only during fast transient ESD events, and can be implemented in small size and having negligible parasitic capacitance. As a result, the ESD protection circuit 200 provides robust ESD protection for different types of ESD events, which prevents or reduces device failure. The second ESD protection circuit can be implemented with low cost (e.g., due to the small size) and negligible impact on the power consumption and parasitic capacitance of the RFIC device.

Embodiments of the present invention are summarized here. Other embodiments can also be understood from the entirety of the specification and the claims filed herein.

Example 1. In an embodiment, a radio frequency integrated circuit (RFIC) device includes: a first RF input/output (I/O) terminal; a second RF I/O terminal, wherein the first RF I/O terminal and the second RF I/O terminal are configured to transmit or receive an RF signal; a capacitor coupled between the first RF I/O terminal and the second RF I/O terminal; a first coil coupled between the first RF I/O terminal and the second RF I/O terminal, wherein the first coil is configured to provide ESD protection to the capacitor during a first ESD event; and a fast transient ESD protection circuit coupled between the first RF I/O terminal and the second RF I/O terminal, wherein the fast transient ESD protection circuit is configured to provide ESD protection to the capacitor during a second ESD event different from the first ESD event, wherein a first rise time of a first ESD current of the first ESD event is longer than a second rise time of a second ESD current of the second ESD event.

Example 2. The RFIC device of Example 1, wherein during the first ESD event, the first coil is configured to conduct an ESD current of the first ESD event while the fast transient ESD protection circuit is inactive.

Example 3. The RFIC device of Example 1, wherein during the second ESD event, the fast transient ESD protection circuit is configured to conduct an ESD current of the second ESD event while the first coil is configured to be in a high-impedance phase.

Example 4. The RFIC device of Example 1, wherein the fast transient ESD protection circuit is configured to be inactive during normal operation of the RFIC device when the RFIC device is transmitting or receiving RF signals without an ESD event.

Example 5. The RFIC device of Example 4, wherein an RF current flows through the first coil during the normal operation of the RFIC device.

Example 6. The RFIC device of Example 1, further comprising: a second coil inductively coupled to the first coil; and an active circuitry coupled to terminals of the second coil, wherein the first coil and the second coil are configured to function as a transformer to relay RF signals between the first coil and the second coil.

Example 7. The RFIC device of Example 1, wherein the fast transient ESD protection circuit comprises: a first plurality of diodes coupled in series and having a first polarity along a first direction; and a second plurality of diodes coupled in series and having a second polarity along a second direction opposite the first polarity along the first direction, wherein the first plurality of diodes is coupled in parallel or in series with the second plurality of diodes between the first RF I/O terminal and the second RF I/O terminal.

Example 8. The RFIC device of Example 7, wherein the first plurality of diodes and the second plurality of diodes are STI bound pn diodes, STI bound np diodes, no-STI bound pn diodes, or no-STI bound np diodes.

Example 9. The RFIC device of Example 1, wherein the fast transient ESD protection circuit comprises a plurality of NMOS diodes or a plurality of PMOS diodes coupled in series between the first RF I/O terminal and the second RF I/O terminal.

Example 10. The RFIC device of Example 1, wherein the fast transient ESD protection circuit comprises an NMOS diode coupled in series with a gate-grounded NMOS transistor between the first RF I/O terminal and the second RF I/O terminal.

Example 11. The RFIC device of Example 1, wherein the fast transient ESD protection circuit comprises: a first NMOS transistor and a second NMOS transistor coupled in an anti-series configuration between the first RF I/O terminal and the second RF I/O terminal; a first diode coupled in series with a first resistor between the first RF I/O terminal and the second RF I/O terminal, wherein a cathode of the first diode is coupled to the first RF I/O terminal, and a first node between the first diode and the first resistor is coupled to a gate of the second NMOS transistor; and a second diode coupled in series with a second resistor between the first RF I/O terminal and the second RF I/O terminal, wherein a cathode of the second diode is coupled to the second RF I/O terminal, and a second node between the second diode and the second resistor is coupled to a gate of the first NMOS transistor.

Example 12: In an embodiment, a radio frequency integrated circuit (RFIC) device includes: a first RF input/output (I/O) pin and a second RF I/O pin that are configured to transmit or receive a first RF signal; a capacitor coupled between the first RF I/O pin and the second RF I/O pin; a first coil coupled in parallel with the capacitor, wherein the first coil is configured to provide ESD protection to the capacitor during a first ESD event, wherein the first ESD event has a first rise time for a first ESD current of the first ESD event; and a fast transient ESD protection circuit coupled in parallel with the capacitor, wherein the fast transient ESD protection circuit is configured to provide ESD protection to the capacitor during a second ESD event, wherein the second ESD event has a second rise time for a second ESD current of the second ESD event, wherein the second rise time is shorter than the first rise time, wherein the fast transient ESD protection circuit is configured to be inactive during the first ESD event and during normal operation of the RFIC device when the RFIC device is transmitting or receiving RF signals without ESD events.

Example 13. The RFIC device of Example 12, wherein the first rise time is longer than 100 ps, and the second rise time is shorter than 100 ps.

Example 14. The RFIC device of Example 12, wherein during the first ESD event, the first coil is configured to conduct the first ESD current of the first ESD event while the fast transient ESD protection circuit is non-conducting.

Example 15. The RFIC device of Example 12, wherein during the second ESD event, the fast transient ESD protection circuit is configured to conduct the second ESD current of the second ESD event while the first coil is configured to be in a high-impedance phase.

Example 16. The RFIC device of Example 12, further comprising: a second coil inductively coupled to the first coil; and a circuit coupled to terminals of the second coil, wherein the circuit is configured to transmit or receive a second RF signal at terminals of the second coil, wherein the second RF signal is proportional to the first RF signal.

Example 17. In an embodiment, a radio frequency integrated circuit (RFIC) device includes: a first RF input/output (I/O) pin and a second RF I/O pin that are configured to be coupled to an external antenna; a capacitor coupled between the first RF I/O pin and the second RF I/O pin; a transformer having a primary winding and a secondary winding, wherein terminals of the primary winding are coupled to the first RF I/O pin and the second RF I/O pin, wherein the transformer is configured to relay RF signals between the primary winding and the secondary winding during normal operation of the RFIC device; an active circuitry coupled to terminals of the secondary winding; and an ESD protection circuit coupled between the first RF I/O pin and the second RF I/O pin, wherein the primary winding of the transformer is configured to provide ESD protection to the capacitor during a first ESD event, wherein the ESD protection circuit is configured to provide ESD protection to the capacitor during a second ESD event, wherein a second rise time of the second ESD event is shorter than a first rise time of the first ESD event, wherein during the first ESD event, the primary winding conducts an ESD current of the first ESD event while the ESD protection circuit is non-conducting, wherein during the second ESD event, the ESD protection circuit conducts an ESD current of the second ESD event while the primary winding is in a high-impedance phase.

Example 18. The RFIC device of Example 17, wherein the first rise time is longer than 100 ps, and the second rise time is shorter than 100 ps.

Example 19. The RFIC device of Example 17, wherein the ESD protection circuit comprises diodes coupled in series or in parallel between the first RF I/O pin and the second RF I/O pin.

Example 20. The RFIC device of Example 17, wherein the ESD protection circuit, the capacitor, the primary winding, the secondary winding, and the active circuitry are integrated on a single semiconductor substrate.

What is claimed is:

1. A radio frequency integrated circuit (RFIC) device comprising:
   a first RF input/output (I/O) terminal;
   a second RF I/O terminal, wherein the first RF I/O terminal and the second RF I/O terminal are configured to transmit or receive an RF signal;
   a capacitor coupled between the first RF I/O terminal and the second RF I/O terminal;
   a first coil coupled between the first RF I/O terminal and the second RF I/O terminal, wherein the first coil is configured to provide ESD protection to the capacitor during a first ESD event; and
   a fast transient ESD protection circuit coupled between the first RF I/O terminal and the second RF I/O terminal, wherein the fast transient ESD protection circuit is configured to provide ESD protection to the capacitor during a second ESD event different from the first ESD event, wherein a first rise time of a first ESD current of the first ESD event is longer than a second rise time of a second ESD current of the second ESD event, wherein during the first ESD event, the first coil is configured to conduct an ESD current of the first ESD event while the fast transient ESD protection circuit is inactive.

2. The RFIC device of claim 1, wherein during the second ESD event, the fast transient ESD protection circuit is configured to conduct an ESD current of the second ESD event while the first coil is configured to be in a high-impedance phase.

3. The RFIC device of claim 1, wherein the fast transient ESD protection circuit is configured to be inactive during normal operation of the RFIC device when the RFIC device is transmitting or receiving RF signals without an ESD event.

4. The RFIC device of claim 3, wherein an RF current flows through the first coil during the normal operation of the RFIC device.

5. The RFIC device of claim 1, further comprising:
   a second coil inductively coupled to the first coil; and
   an active circuitry coupled to terminals of the second coil, wherein the first coil and the second coil are configured to function as a transformer to relay RF signals between the first coil and the second coil.

6. The RFIC device of claim 1, wherein the fast transient ESD protection circuit comprises:
   a first plurality of diodes coupled in series and having a first polarity along a first direction; and
   a second plurality of diodes coupled in series and having a second polarity along a second direction opposite the first polarity along the first direction, wherein the first plurality of diodes is coupled in parallel or in series with the second plurality of diodes between the first RF I/O terminal and the second RF I/O terminal.

7. The RFIC device of claim 6, wherein the first plurality of diodes and the second plurality of diodes are STI bound pn diodes, STI bound np diodes, no-STI bound pn diodes, or no-STI bound np diodes.

8. The RFIC device of claim 1, wherein the fast transient ESD protection circuit comprises a plurality of NMOS diodes or a plurality of PMOS diodes coupled in series between the first RF I/O terminal and the second RF I/O terminal.

9. The RFIC device of claim 1, wherein the fast transient ESD protection circuit comprises an NMOS diode coupled in series with a gate-grounded NMOS transistor between the first RF I/O terminal and the second RF I/O terminal.

10. The RFIC device of claim 1, wherein the fast transient ESD protection circuit comprises:
    a first NMOS transistor and a second NMOS transistor coupled in an anti-series configuration between the first RF I/O terminal and the second RF I/O terminal;
    a first diode coupled in series with a first resistor between the first RF I/O terminal and the second RF I/O terminal, wherein a cathode of the first diode is coupled to the first RF I/O terminal, and a first node between the first diode and the first resistor is coupled to a gate of the second NMOS transistor; and
    a second diode coupled in series with a second resistor between the first RF I/O terminal and the second RF I/O terminal, wherein a cathode of the second diode is coupled to the second RF I/O terminal, and a second node between the second diode and the second resistor is coupled to a gate of the first NMOS transistor.

11. A radio frequency integrated circuit (RFIC) device comprising:
    a first RF input/output (I/O) pin and a second RF I/O pin that are configured to transmit or receive a first RF signal;
    a capacitor coupled between the first RF I/O pin and the second RF I/O pin;
    a first coil coupled in parallel with the capacitor, wherein the first coil is configured to provide ESD protection to the capacitor during a first ESD event, wherein the first ESD event has a first rise time for a first ESD current of the first ESD event; and
    a fast transient ESD protection circuit coupled in parallel with the capacitor, wherein the fast transient ESD protection circuit is configured to provide ESD protection to the capacitor during a second ESD event, wherein the second ESD event has a second rise time for a second ESD current of the second ESD event, wherein the second rise time is shorter than the first rise time, wherein the fast transient ESD protection circuit is configured to be inactive during the first ESD event and during normal operation of the RFIC device when the RFIC device is transmitting or receiving RF signals without ESD events.

12. The RFIC device of claim 11, wherein the first rise time is longer than 100 ps, and the second rise time is shorter than 100 ps.

13. The RFIC device of claim 11, wherein during the first ESD event, the first coil is configured to conduct the first ESD current of the first ESD event while the fast transient ESD protection circuit is non-conducting.

14. The RFIC device of claim 11, wherein during the second ESD event, the fast transient ESD protection circuit is configured to conduct the second ESD current of the second ESD event while the first coil is configured to be in a high-impedance phase.

15. The RFIC device of claim 11, further comprising:
    a second coil inductively coupled to the first coil; and
    a circuit coupled to terminals of the second coil, wherein the circuit is configured to transmit or receive a second RF signal at terminals of the second coil, wherein the second RF signal is proportional to the first RF signal.

16. A radio frequency integrated circuit (RFIC) device comprising:
- a first RF input/output (I/O) pin and a second RF I/O pin that are configured to be coupled to an external antenna;
- a capacitor coupled between the first RF I/O pin and the second RF I/O pin;
- a transformer having a primary winding and a secondary winding, wherein terminals of the primary winding are coupled to the first RF I/O pin and the second RF I/O pin, wherein the transformer is configured to relay RF signals between the primary winding and the secondary winding during normal operation of the RFIC device;
- an active circuitry coupled to terminals of the secondary winding; and
- an ESD protection circuit coupled between the first RF I/O pin and the second RF I/O pin, wherein the primary winding of the transformer is configured to provide ESD protection to the capacitor during a first ESD event, wherein the ESD protection circuit is configured to provide ESD protection to the capacitor during a second ESD event, wherein a second rise time of the second ESD event is shorter than a first rise time of the first ESD event, wherein during the first ESD event, the primary winding conducts an ESD current of the first ESD event while the ESD protection circuit is non-conducting, wherein during the second ESD event, the ESD protection circuit conducts an ESD current of the second ESD event while the primary winding is in a high-impedance phase.

17. The RFIC device of claim 16, wherein the first rise time is longer than 100 ps, and the second rise time is shorter than 100 ps.

18. The RFIC device of claim 16, wherein the ESD protection circuit comprises diodes coupled in series or in parallel between the first RF I/O pin and the second RF I/O pin.

19. The RFIC device of claim 16, wherein the ESD protection circuit, the capacitor, the primary winding, the secondary winding, and the active circuitry are integrated on a single semiconductor substrate.

20. The RFIC device of claim 1, wherein the first rise time is longer than 100 ps, and the second rise time is shorter than 100 ps.

* * * * *